(12) United States Patent  (10) Patent No.: US 6,537,848 B2
Camenforte et al.  (45) Date of Patent: Mar. 25, 2003

(54) SUPER THIN/SUPER THERMAL BALL GRID ARRAY PACKAGE

(75) Inventors: Raymundo M. Camenforte, Singapore (SG); Dioscoro A. Merilo, Singapore (SG); Seng Guan Chow, Singapore (SG)

(73) Assignee: St. Assembly Test Services Ltd., Singapore (SG)

( * ) Notice: Subject to any disclaimer, the term of this patent is extended or adjusted under 35 U.S.C. 154(b) by 0 days.

(21) Appl. No.: 09/867,095

(22) Filed: May 30, 2001

(65) Prior Publication Data

US 2002/0180040 A1 Dec. 5, 2002

(51) Int. Cl.[7] .......................... H01L 21/44; H01L 21/48; H01L 21/50
(52) U.S. Cl. .......................... 438/106; 438/118; 438/64; 438/124; 438/108; 438/112; 438/126; 257/738; 257/780; 257/675; 257/778
(58) Field of Search .................... 438/118, 106, 438/121, 122, 124, 126, 127, 112, 108, 64, 25; 257/738, 774, 779, 780, 700, 718, 710, 712, 713, 730, 675, 778

(56) References Cited

U.S. PATENT DOCUMENTS

| | | | |
|---|---|---|---|
| 5,369,274 A | 11/1994 | Brünger | 50/306 |
| 5,440,123 A | 8/1995 | Ikeda | 250/307 |
| 5,583,377 A | 12/1996 | Higgins, III | 257/707 |
| 5,583,378 A * | 12/1996 | Marrs et al. | 257/710 |
| 5,620,928 A | 4/1997 | Lee et al. | 438/118 |
| 5,696,666 A | 12/1997 | Miles et al. | 361/764 |
| 5,747,803 A | 5/1998 | Doong | 250/307 |
| 5,768,774 A * | 6/1998 | Wilson et al. | 29/840 |
| 5,943,212 A | 8/1999 | Horiuchi et al. | 361/704 |
| 5,977,543 A | 11/1999 | Ihn et al. | 250/311 |
| 5,986,340 A | 11/1999 | Mostafazadeh et al. | 257/713 |
| 5,998,241 A * | 12/1999 | Niwa | 438/122 |
| 5,999,415 A * | 12/1999 | Hamzehdoost | 361/803 |
| 6,020,637 A | 2/2000 | Karnezos | 257/738 |
| 6,034,427 A | 3/2000 | Lan et al. | 257/698 |
| 6,066,512 A * | 5/2000 | Hashimoto | 438/112 |
| 6,103,550 A | 8/2000 | Camenforte et al. | 438/107 |
| 6,114,760 A | 9/2000 | Kim et al. | 257/697 |
| 6,184,580 B1 * | 2/2001 | Lin | 257/712 |
| 6,175,497 B1 * | 6/2001 | Tseng et al. | 361/704 |
| 6,242,279 B1 * | 6/2001 | Ho et al. | 438/106 |
| 6,258,631 B1 * | 7/2001 | Ito et al. | 438/123 |
| 6,323,065 B1 * | 11/2001 | Karnezos | 438/122 |
| 6,373,131 B1 * | 4/2002 | Karnezos | 257/712 |
| 6,395,582 B1 * | 5/2002 | Sohn et al. | 438/111 |
| 6,403,401 B1 * | 6/2002 | Aquien et al. | 438/122 |

* cited by examiner

Primary Examiner—David Nelms
Assistant Examiner—Andy Huynh
(74) Attorney, Agent, or Firm—George O. Saile; Stephen B. Ackerman (57) ABSTRACT

In a first embodiment of the invention, a copper foil is attached to a substrate, in the second embodiment of the invention a adhesive film is attached to a substrate. Processing then continues by attaching the die to the copper foil/adhesive film. After this the processing continues identically for the two embodiments of the invention, interrupted by, for the second embodiment of the invention, detaching the film and replacing the film with a copper foil.

13 Claims, 4 Drawing Sheets

SUPER THIN/SUPER THERMAL BALL GRID ARRAY PACKAGE

BACKGROUND OF THE INVENTION (1) Field of the Invention

The invention relates to the fabrication of integrated circuit devices, and more particularly, to a method and package for the packaging of Ball Grid Array semiconductor devices.

(2) Description of the Prior Art

Semiconductor devices have since the inception of the semiconductor technology been improved in device performance by packaging more function per package. Not only is the functional capability of a semiconductor device package increased, concurrently the size of the package in which the semiconductor devices are mounted continues to be decreased.

The process of packaging semiconductor devices typically starts with a substrate that is ceramic or plastic based, the devices are mounted on the surface of the substrate while layers of interconnect lines and vias are formed that connect the devices to its surrounding circuitry. Many different approaches are known and have been used for the mounting and interconnecting of multiple semiconductor devices, such as Dual-In-Line packages (DIP), Pin Grid Arrays (PGA), Plastic Leaded Chip Carriers (PLCC) and Quad Flat Packages (QFP). Multi-layer structures have further been used to connect physically closely spaced integrated circuits with each other. Using these techniques, a single substrate serves as an interconnect medium, multiple chips are connected to the interconnect medium forming a device package with high packaging density and dense chip wiring. The chip wiring contains layers of interconnect metal that are interconnected with interconnect vias, layers of dielectric (such as polyimide) or insulating layers separate metal layers that make up the interconnect network and the vias and contact points that establish connections between the interconnect networks.

The Quad Flat Package (QFP) has been created to achieve high pin count integrated packages with various pin configurations. The pin Input/Output (I/O) connections for these packages are typically established by closely spaced leads distributed along the four edges of the flat package. This limits the I/O count of the packages and therefore the usefulness of the QFP. The Ball Grid Array (BGA) package has been created whereby the I/O connects for the package are distributed around the periphery of the package and over the complete bottom of the package. The EGA package can therefore support more I/O points and provides a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Another packaging concept is realized with the use of so-called flip chips. The flip chip is a semiconductor device that has conductive layers formed on its top surface, external electrical interconnects can be made to these conductive layers by wire bonding selected points of the conductive layers to surrounding circuitry or interconnect lines. The top surface of the flip chip is further provided with so-called solder bumps. At the time of assembly of the flip chip, the chip is turned over (flipped over) so that the solder bumps are now facing downwards and toward the circuit board, typically a printed circuit board, on which the flip chip is to be mounted.

It is clear from the above that a method and package that can be used to package a semiconductor device with high reliability, low packaging cost and a small package size offers considerable competitive advantages in the semiconductor industry. The invention addresses such a package.

U.S. Pat. No. 6,103,550 (Camenforte) shows a molded tape support for a molded circuit package prior to dicing.

U.S. Pat. No. 6,114,760 (Kim et al.) shows a package/method with cavity down, print screening and wire bonding.

U.S. Pat. No. 6,034,427 (Lan et al.) shows package/method with Cu foil, cavity down, print screening and wire bonding.

U.S. Pat. No. 5,696,666 (Miles et al.), U.S. Pat. No. 5,620,928 (Lee et al.), U.S. Pat. No. 5,583,377 (Higgins, III), U.S. Pat. No. 5,986,340 (Mostafazadeh et al.) U.S. Pat. No. 6,020,637( Karnezos) and U.S. Pat. No. 5,943,212 (Horiuchi et al.) show related patents.

SUMMARY OF THE INVENTION

A principle objective of the invention is to provide a method and package for packaging semiconductor devices that results in a very thin Ball Grid Array package.

In accordance with the objectives of the invention a new method and package is provided for the packaging of semiconductor devices. The method and package starts with a semiconductor substrate, the substrate is pre-baked. In the first embodiment of the invention, a copper foil is attached to the substrate, in the second embodiment of the invention an adhesive film is attached to the substrate. Processing then continues by attaching the die to the copper foil under the first embodiment of the invention and to the film under the second embodiment of the invention. After this the processing continues identically for the two embodiments of the invention with steps of curing, plasma cleaning, wire bonding, optical inspection, plasma cleaning and providing a molding around the die and the wires connected to the die. For the second embodiment of the invention, the film is now detached and replaced with a copper foil. After this the processing for two embodiments of the invention again commonly proceeds with providing a black ink topping, performing an ink and post mold cure, attaching solder balls to the substrate, providing laser markings on the black ink topping, singulation of the die, inspection and testing after which the devices are packed and shipped as completed devices.

DESCRIPTION OF THE PREFERRED EMBODIMENTS

The invention is described after first describing prior art applications that most closely resemble the invention, special attention will be paid to three inventions, that is U.S. Pat. No. 5,696,666 (Miles et al.), U.S. Pat. No. 5,620,928 (Lee et al.). and Higgins III (U.S. Pat. No. 5,583,377).

The first referenced patent, U.S. Pat. No. 5,620,928 (Lee et al.), is addressed first. Provided in this patent is a method of producing an ultra-thin Ball Grid Array. This is accomplished by minimizing or eliminating the thickness of the substrate on which the device is being mounted and replacing this substrate, during the assembly of a semiconductor package, with a temporary supporting substrate or carrier to support other components of the package. Lee et al. make use of three sub-components in their packaging approach, that is 1) a semiconductor device, 2) electrically conductive traces that interconnect the device with external (to the package) points of Input/Output (I/O) and 3) an encapsulation material that encapsulates the semiconductor die and portions of the electrically conductive traces. Using these sub-components, Lee et al. use the following procedure for manufacturing an integrated circuit (IC) device package. A temporary support substrate or carrier is provided which is used to support the IC during the time that the IC is being assembled. The semiconductor die is temporarily (by for instance a double-sided adhesive tape) attached to the support substrate while the electrically conductive traces, typically contained in a substrate, are equally positioned on the surface of the temporary support substrate. The semiconductor die and the electrically conductive traces are placed on the surface of the temporary support substrate in a relative position that is the same as the relative position in which these two elements are to be mounted in the final assembly. The semiconductor die is now connected to the contact points that have been provided in the surface of the electrically conductive traces, typically using bond wires. After this interconnection of the die to the conductive traces is complete, the die (and with that part of the interconnecting wires such as bond wires) are encapsulated. This creates a rigid package of the die and the substrate which contains the interconnect traces. The encapsulation has not affected the surface of the die and the substrate that contains the conductive traces that is in contact with the double-sided adhesive tape. At the end of the encapsulation, the rigid component comprising the die and the interconnect substrate are removed from the temporary support substrate, exposing the (not affected by the encapsulation) bottom surface of the die and the interconnect substrate. Contact pads are provided in the bottom surface of the interconnect substrate, these contact pads can now be connected to contact balls. A protective coating may be applied over the bottom surface of the die, no points of electrical interconnect are provided in the bottom surface of the integrated circuit die.

The thickness of the package that is provided by Lee et al. is thinner than other prior art packages because the substrate that is typically required to support the integrated die has been eliminated below the die. This method of mounting a semiconductor device further removes the need for rigid support of the die while the die is being mounted because this rigid support is provided by the temporary support substrate. The interconnect substrate (containing the conductive traces) can therefore be flex tape which comprises one or more layers of interconnect lines. Additional embodiments of Lee et al. provide for the use of flex tape (as the interconnect substrate containing interconnect traces), a flip chip approach with solder balls on one surface of the flip chip making contact with contact pads in the surface of the interconnect substrate and a flip chip approach with the addition of providing additional contact balls in a second surface of the flip chip which are connected to the interconnect substrate by means of bonding wires.

Figure 1:
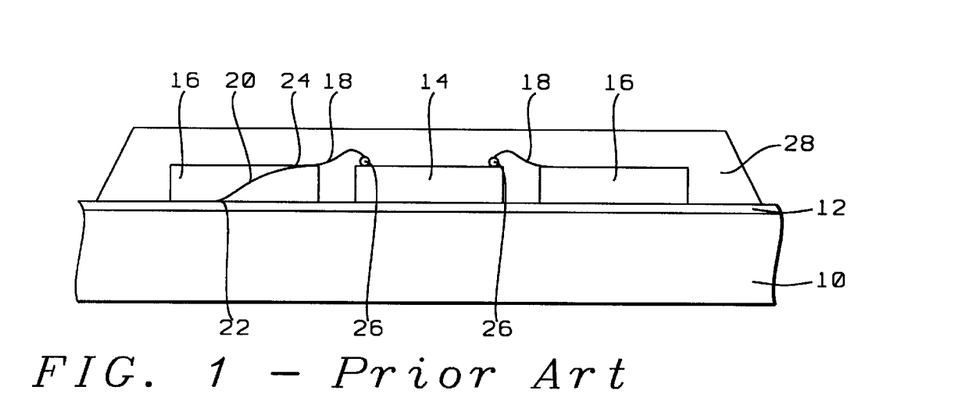
FIG. 1 shows a cross section of a first prior art semiconductor package.

FIG. 1 shows a cross section that has been extracted from Lee et al. The elements that are highlighted in FIG. 1 are the following:

10, a temporary support substrate carrier 12, a double sided adhesive tape 14, a semiconductor die 16, a dielectric interconnect substrate containing interconnect traces; an opening has been created in the interconnect substrate, the die 14 is placed inside this opening; this interconnect substrate can take forms others than the form that is shown in cross section in FIG. 1 such as single strips and the like; the number of layers of interconnect traces contained within the interconnect substrate is also not determinate 18, bond wires that connect contact points on the top surface of die 14 with contact points that have been provided in the top surface of the interconnect substrate 16

20, a (symbolic and representative) interconnect between contact points on the top surface of interconnect substrate 16 and contact points on the bottom surface of the interconnect substrate 16

22, a contact point provided on the bottom surface of the interconnect substrate 16

24, a contact point provided on the top surface of the interconnect substrate 16

26, contact points provided on the top surface of the IC die 14

28, an encapsulant that encapsulates die 14, the interconnects 18 and the interconnect substrate 16.

The above highlighted method and procedure is clear from the cross section that is shown in FIG. 1. The die 14 is, together with and placed in correct position with respect to the interconnect substrate 16, placed on the top surface of the temporary support substrate 10. After the interconnections (18) have been established between the die 14 and the interconnect substrate 16, the two latter units are encapsulated (28) and can, after the encapsulation material has hardened, be removed as one unit from the surface of the temporary support substrate 10.

Figure 2:
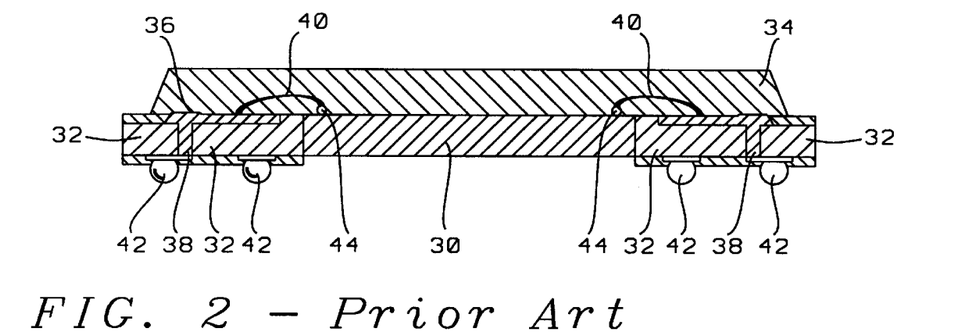
FIG. 2 shows a cross section of a second prior art semiconductor package.

Miles et al. provide for a low profile exposed die chip carrier package, a cross section of the package that is provided by Miles et al. is shown in FIG. 2. Shown in the cross section of FIG. 2 are:

30, a semiconductor die 32, a Printed Circuit Board, in which an opening (not highlighted in FIG. 2) has been created for the insertion of semiconductor die 30

34, a glob top or transfer molded encapsulation 36, a contact point on the surface of the PCB 32

38, a conductive via through the PCB 32

40, wire bond connections between a point of contact in a surface of die 30 and a contact pad (not shown in FIG. 2) on the surface of PCB 32

42, solder balls or bumps on the bottom surface of the PCB 32

44, ball bond or first bond on the surface of the die 30.

The method of interconnecting semiconductor die 30 using a PCB 32 is clear from the cross section that is shown in FIG. 2. Pads 44 are the I/O interconnect points of die 30, these pads 44 are connected to interconnect traces provided in PCB 32 by means of bond wires 40. The PCB 32 may have one or more layers of interconnect metal comprised therein (not shown in FIG. 2), these interconnect traces make contact with solder bumps 42, establishing an electrical path of conductivity between pads 44 and 42. From 42 the die 30 is interconnected to surrounding circuitry.

Figure 3:
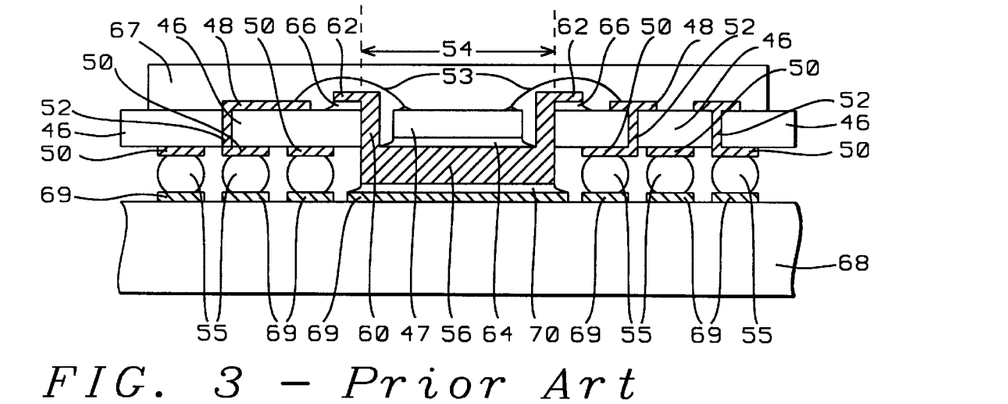
FIG. 3 shows a cross section of a third prior art semiconductor package.

Higgins et al. provide a pad array semiconductor device having a heat sink with a die receiving unit. FIG. 3 shows a cross section of one of the packages that is provided by Higgins et al. Shown in this cross section are the following elements of the package:

- 46, an interconnect substrate
- 47, a semiconductor die
- 48, conductive traces on the surface of interconnect substrate
- 50, conductive pads that are the end points of conductive traces provided in interconnect substrate 46
- 52, conductive vias that are provided through the interconnect substrate 46
- 53, bond wires that connect contact points on the surface of die 47 with conductive traces 48 provided on the surface of interconnect substrate 46
- 54, the width of an opening that has been provided through the interconnect substrate 46 for the insertion of a semiconductor device 47 and a heat sink 56
- 55, solder balls that interconnect conductive pads 50 with solder pads 69 provided on the user substrate 68
- 56, a heat sink
- 58, the base portion of heat sink 56
- 60, sidewalls of heatsink 56
- 62, flanges of heat sink 56
- 64, die attach material used to mount the die 47 on the base portion 58 of heat sink 56
- 66, adhesive material, used to secure the flanges 62 of the heat sink 56 to the ledge of the interconnect substrate 46
- 67, a molded package body which encapsulates die 47
- 68, a user substrate to which the package can be attached
- 69, solder pads provided on the surface of the user substrate 68,
- 70, a thermally conductive bonding material that can be applied between the heat sink 56 and the user substrate 68.

Figure 4:
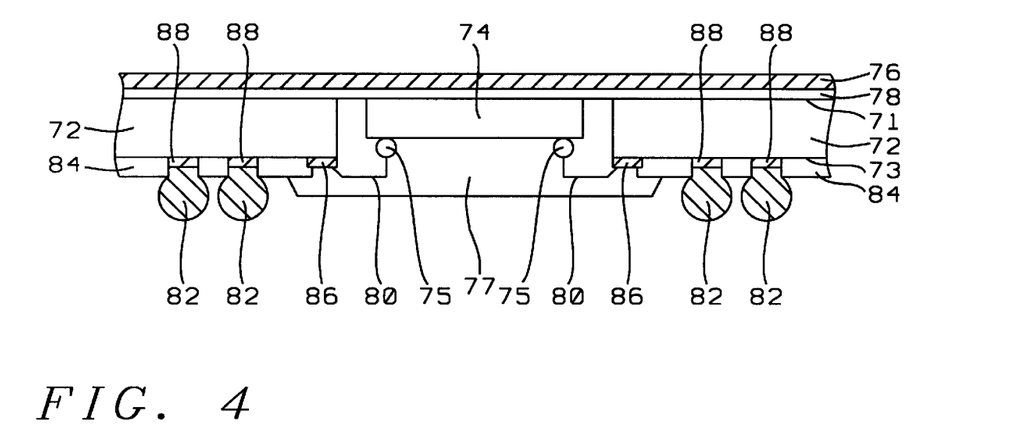
FIG. 4 shows a cross section of the semiconductor package of the invention.

Referring now specifically to FIG. 4, there is shown a cross section of the BGA package of the invention. Highlighted in FIG. 4 are the following:

- 72, a semiconductor substrate which can comprise a Printed Circuit Board or flex tape substrate or any other conventional interconnect substrate that is provided for providing one or more layers of interconnect traces in one or more overlying layers, points of electrical access may be provided in one or both surfaces of the interconnect substrate
- 74, a semiconductor die that is mounted in the package of the invention
- 75, ball bond pads or bonding pads on the surface of semiconductor die 74 that provide electrical access to die 74
- 76, a copper foil that is provided over the surface of the substrate 72 under the first embodiment of the invention; under the second embodiment of the invention, this layer is an adhesive film, typically a polyimide based film to which an additive has been provided for improved adhesive characteristics
- 77, a molding that has been provided surrounding the die 74, the bond wires 80 and part of contact pads 86
- 78, copper traces that have been provided overlying top surface 71 of substrate 72; these copper traces are in electrical contact with points of contact (not shown in FIG. 4) that are provided in the top surface 71 of substrate 72
- 80, wire bond connections that connect points of electrical contact in the surface of die 74 with contact points 86 that have been provided in or on the surface 73 of the substrate 72
- 82, contact balls that are connected to contact pads 88 that have been provided in or on the surface 73 of substrate 72
- 84, a solder mask overlying the surface 73 of substrate 72, openings in the solder mask provide access to contact pads 86 and 88 that have been provided in the surface of substrate 72
- 86, contact pads that have been provided in the surface 73 of substrate 72 for wire bond connections 80 with die 74
- 88, contact pads that have been provided in the surface 73 of substrate 72 for connections with an array of contact balls 82.

It must be pointed out that the term substrate as used in the method and package of the invention refers to a substrate 72, that has been provided with points of electrical contact in the surface 71 and 73 of substrate 72, that further has been provided with the solder mask 84 and openings that make this layer 84 into a solder mask, that has further been provided with copper traces 78 on surface 71 of substrate 72. The substrate 72 that is shown in cross section in FIG. 4 typically is processed as a larger unit (larger than the one die 74 containing unit that is shown in FIG. 4). Further, in the process for the creation of the package of the invention that is shown in cross section in FIG. 4, the substrate 72 that is used for this process has already been provided with openings for the insertion of die 74. The creation of these openings is therefore not considered part of the process of the invention. These elements of the package that is shown in cross section in FIG. 4 are therefore assumed to be present on the surface of a substrate and will therefore not be further discussed, since these elements do not need to be created as part of the method and package of the invention. A layer 78 of copper traces has also been provided over the second surface 71 of substrate 72.

To summarize, the process of the invention starts with a substrate 72 that has been provided with:

- 78, the copper traces on surface 71 of substrate 72
- contact pads 86 and 88
- solder mask 84
- an opening for the insertion of die 74.

Keeping in mind the cross section that is shown in FIG. 4, the steps that are required to create this package are discussed next, using the flow diagram of FIG. 5 for the first embodiment of the invention and the flow diagram of FIG. 6 for the second embodiment of the invention.

Figure 5:
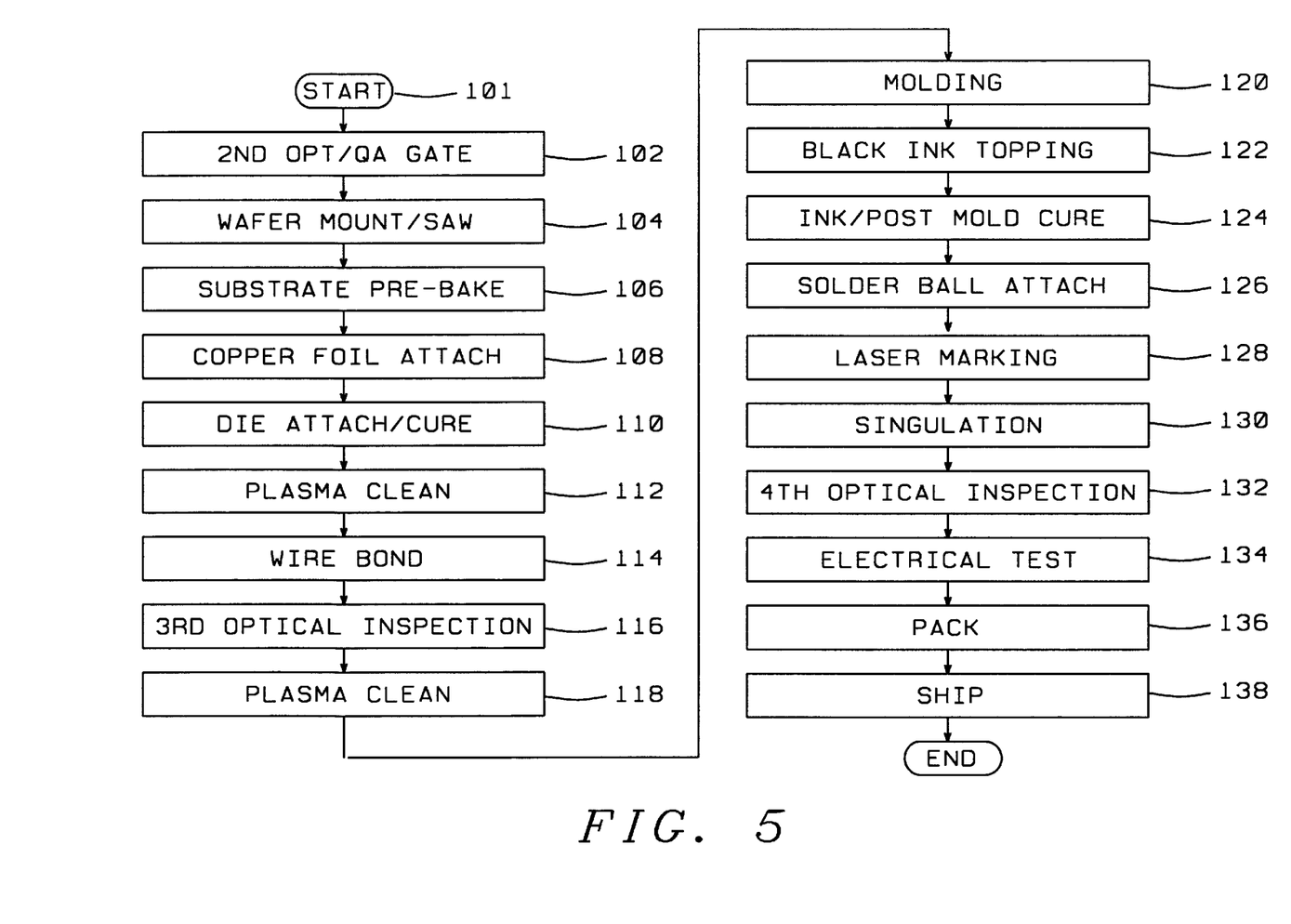
FIG. 5 shows a flow chart of the processing steps required for the first embodiment of the invention.
Figure 6:
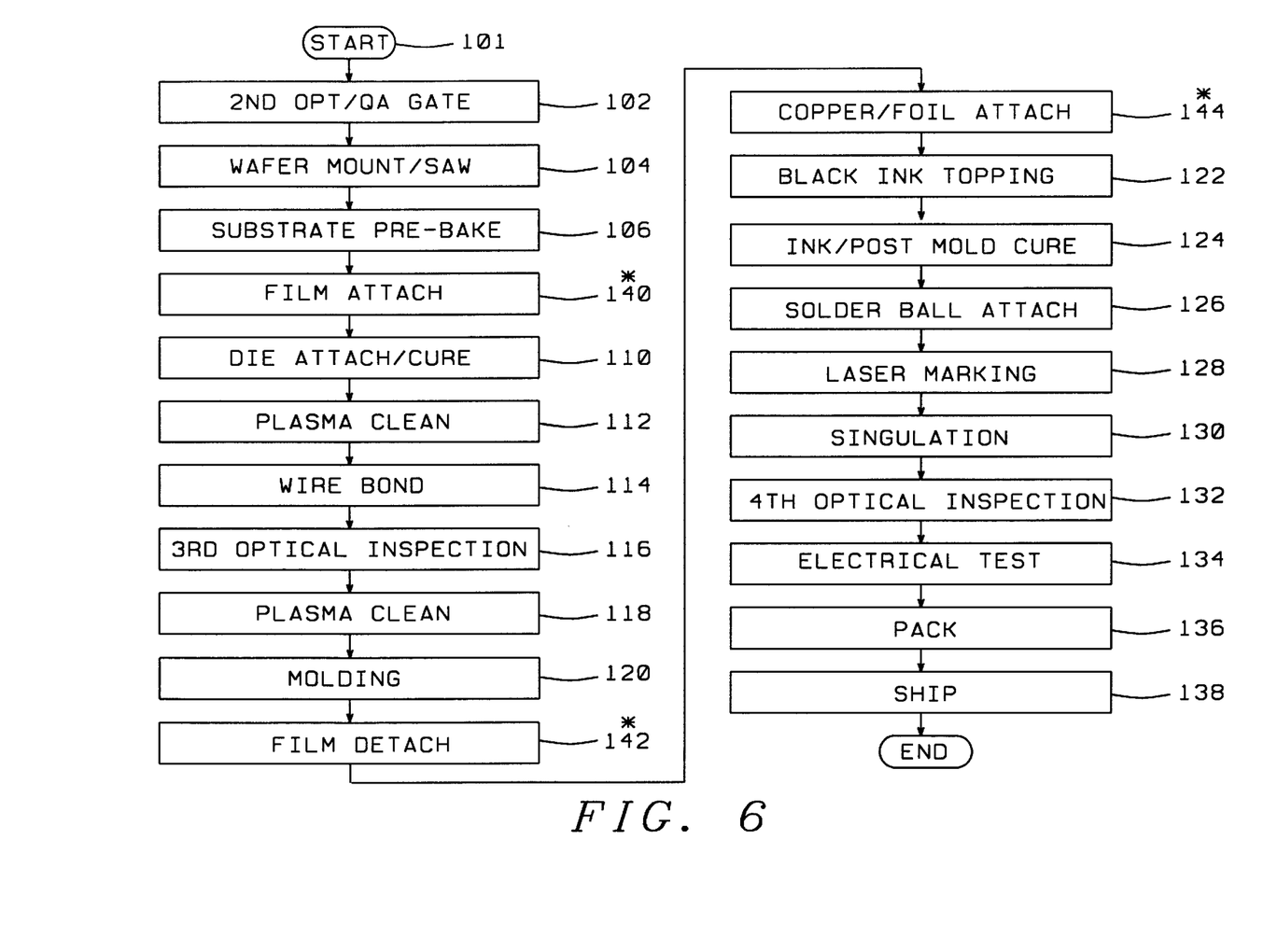
FIG. 6 shows a flow chart of the processing steps required for the second embodiment of the invention.

In this discussion of the two flow diagrams that are shown in FIGS. 5 and 6, steps that are standard procedures will not be discussed in detail since the methods and procedures of these steps are well known in the art and since in addition these steps are not what makes the invention unique. Among this category of steps fall such procedures as pre-bake procedures, curing, plasma clean and the like. These steps are mentioned in the flow diagrams of FIGS. 5 and 6 since these steps, although well known, are essential to successfully create the package of the invention.

The following processing steps for the first embodiment of the invention are highlighted in FIG. 5:

101, start of the process 102, inspection of the die prior to die mounting and dicing process 104, the wafer is mounted to a dicing tape 106, the substrate 72 is pre-baked for improved adhesion of overlying layers (of adhesive film) and for minimizing moisture 108, a copper foil 76 is attached to the copper traces 78 that have been provided on the second surface 71 of the substrate 72; the copper foil 76 is kept in place by means of an adhesive layer (not shown) that has been pre-applied over the surface of the foil 110, the semiconductor die 74 is inserted in the opening that has been provided for this purpose in the substrate 72; the substrate 72 is subjected to a curing cycle in order to improve adhesion of attaching die 74 to the copper foil 76

112, the surfaces are plasma cleaned 114, wire bond connections 80 are established; this connects, as shown in the cross section of FIG. 4, the electrical interconnections between contact points 75 on the surface of the semiconductor die and contact pads 86 provided on the surface of the substrate 72; for the wire bonding, aluminum or gold wires can be used, the end of the wire bonds are connected to the bond pads of the substrate by ultra sonic heating, melting and bonding the ends of the bond wires to the contact pad 116, the unit is (optically) inspected for any poor or missing connections, surface impurities and the like 118, the surface is again plasma cleaned 120, the molding 77 is provided surrounding the semiconductor die 74 and the bond wires 80; molding 77 further partially overlaps the solder mask 84 that has been provided on the first surface 73 of the substrate 72; conventional or automatic methods of using a transfer molding with mold chase is used for this purpose 122, a black ink topping is provided over the exposed surface is the copper foil 76, using methods of screen printing 124, ink cure and post mold cure are performed simultaneously 126, the solder balls 82 are attached, using the solder mask 84 as a guide in placing the solder balls 82 with respect to the substrate 72

128, laser marking is provided overlying the previously applied black ink topping 130, the multiple unit substrate is divided (singulated) into single units, each single unit comprising a single semiconductor die 74

132, the singulated package is (optically) inspected for any irregularities that are visually observable 134, the singulated package is electrically tested 136, the singulated packages that pass the electrical tests are packed for shipment 138, the singulated packages are shipped.

In view of the significant similarity between the processing flow of the second embodiment of the invention as shown in FIG. 6 and the processing flow of the first embodiment of the invention that is shown in FIG. 5, all reference numbers of these two figures that refer to the same operation have been kept the same. Where the reference numbers of FIG. 6 are different from the reference numbers that have been used in FIG. 5, the reference numbers of FIG. 6 have been given a new numeric value and are, in addition, highlighted with an asterisk (*) This provides an easy method of comparing FIGS. 5 and 6.

From this comparison it is clear that step 108 of the first embodiment of the invention is, under the second embodiment of the invention, replaced with step 140, where at this time in the processing cycle, an adhesive film is attached to copper traces 78 that have been provided to the second surface 71 of the substrate 72. This adhesive film provides mechanical support for the substrate 72, essentially for the subsequent operations of wire bond attach and provided a molding compound around the device and the bond wires. The process of the second embodiment of the invention after this proceeds as under the first embodiment of the invention up to the point where a molding has been provided. After this step, FIG. 6, step 142 and 144, the adhesive film is removed from the copper traces 78 and a copper foil 76 is attached in its place, also over the copper traces 78 that have been provided over the surface 71 of substrate 72. After this, the processing steps of the first and second embodiment of the invention are alike.

The following observations are in order regarding the invention and previously highlighted prior art packages. These observation focus mainly on the differences between prior art applications and the instant invention.

Regarding Miles et al.:

the semiconductor die is closely fitted inside a cavity that has been provided for the die in FIG. 2 of Miles et al., the die is held in place by an plastic resin encapsulant with small side areas exposed for the molding compound to enter between the cavity and the die with the opening being slightly larger than the die in FIG. 2, Miles et al., molding glob top or transfer molding is applied; the die is held in place with an adhesive material which is applied between a through-cavity opening and the die perimeter for all the applications that are provided by Miles et al., these application are cavity up designs and bond wire on top.

By contrast with Miles et al., the invention:

the die is not closely fitted the invention does not use vacuum for the temporary positioning of the die, the invention in all instances uses adhesive polyimide and/or copper adhesive film for this purpose the invention can use either glob top or a transfer molding the invention is of a cavity down design.

Further comparing Lee et al. with the instant invention:

Lee et al. is a cavity up design (the contact points of the die face upwards)

a dielectric substrate surrounds the die

Lee et al. use flex tape the molding compound covers the entire top surface

In contrast with Lee et al., the instant invention:

is of a cavity down design (the contact points to the die face downwards)

a dielectric substrate overlies a substrate the molding is limited with respect to the cover of the package.

Further comparing Higgins III with the instant invention:

Higgins III uses epoxy between the die and a heat sink

Higgins III uses a heat spreader of complex design.

In contrast with Higgins III, the instant invention:

does not use epoxy uses a copper foil overlying the semiconductor die.

The advantages that are provided with the semiconductor package of the invention can be summarized as follows:

the package is small, thin and light the package is assembled without the use of die attach epoxy the package has improved thermal characteristics which are achieved by attaching a copper layer directly to the backside of the die and the substrate the package has improved performance with respect to Electromagnetic Interference (EMI) and Radio Frequency Interference (RFI), which is achieved by attaching a copper layer to the package the package has improved electrical inductance due to the cavity down design of the package and due to the thin construction of the package.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of creating ultra-thin semiconductor packages, comprising the steps of:
    (a) providing a first substrate having a first and a second surface, said first substrate comprising:
        (i) a multiplicity of second substrates having a first and second surface;
        (ii) an interconnect substrate comprising copper traces for said second substrates, said interconnect substrate having a first and a second surface, said first surface of said interconnect substrate being in contact with said second surface of the first substrate;
        (iii) a solder mask having a first and a second surface for said second substrates;
        (iv) points of electrical contact in the first and the second surface of said first substrate for said second substrates;
        (v) points of electrical interconnect in the first surface of said interconnect substrate;
        (vi) said points of electrical interconnect provided in said first surface of said interconnect substrate being connected with said traces of the interconnect substrate;
        (vii) said points of electrical interconnect provided in the first surface of said interconnect substrate further being electrically connected with points of electrical interconnect provided in the second surface of said second substrates;
        (viii) said solder mask exposing points of electrical contact provided in the first surface of said first substrate for said second substrates;
        (ix) said second substrates provided in said first substrate further having been provided with a cut-out through said first substrate of a size allowing insertion of a semiconductor die therein, said insertion leaving a distance between sidewalls of said die and an internal perimeter of said cut-out through said first substrate;
    (b) optically inspecting said first substrate;
    (c) mounting and cutting said first substrate to a desired size;
    (d) pre-baking said first substrate;
    (e) attaching a copper foil to the second surface of said interconnect substrate;
    (f) inserting a semiconductor die in said cut-out provided in said first substrate for said second substrates, said semiconductor die having a first surface and a second surface, said first surface having been provided with points of electrical contact for said second substrates, said second surface of said semiconductor die being in contact with said first surface of said interconnect substrate;
    (g) curing said first substrate;
    (h) plasma cleaning exposed surfaces of said first substrate;
    (i) providing wire bond connections between points of electrical contact provided in said first surface of said semiconductor die and said points of electrical contact in said first surface of said first substrate;
    (j) optically inspecting said first substrate for defects;
    (k) plasma cleaning said first substrate;
    (l) providing a mold compound surrounding the semiconductor die and the bond wires for said second substrates, said mold compound molding partially overlapping the first surface of the solder mask;
    (m) providing a black ink topping on the second surface of said copper foil for said second substrates;
    (n) curing said black ink topping and said mold compound;
    (o) attaching solder balls to points of electrical contact provided in said first surface of said first substrate for said second substrates, using the solder mask as a guide in placing the solder balls with respect to the second substrates;
    (p) providing laser marking overlying the black ink topping for said second substrates;
    (q) dividing or singulating said first substrate into said second substrates, said second substrates comprising a semiconductor die;
    (r) optically inspecting the singulated second substrates;
    (s) electrically testing the second substrates;
    (t) packaging second substrates that pass the electrical testing; and
    (u) shipping the packaged second substrates.

2. The method of claim 1 wherein said substrate is selected from the group of substrates consisting of printed circuit boards, flex circuits, ceramic substrates, glass substrates and semiconductor device mounting support.

3. The method of claim 1 wherein said step of attaching a copper foil to the second surface of said interconnect substrate for said second substrates is replaced with a step of attaching a adhesive film to the second surface of said interconnect substrate for said second substrates, wherein further additional steps of removing said adhesive film and attaching a copper foil to the second surface of said interconnect substrate for said second substrates are performed after said step of providing a mold compound surrounding the semiconductor die and the bond wires.

4. The method of claim 3 wherein said semiconductor substrate is selected from the group Of substrates consisting of printed circuit boards, flex circuits, ceramic substrates, glass substrates and semiconductor device mounting support.

5. A method of creating ultra-thin semiconductor packages, comprising the steps of:
- (a) providing a substrate having a first and a second surface, said substrate comprising:
  - (i) a multiplicity of second substrates having a first and a second surface;
  - (ii) an interconnect substrate comprising copper traces for said second substrates, said interconnect substrate having a first and a second surface, said first surface of said interconnect substrate being in contact with said second surface of the first substrate;
  - (iii) a solder mask having a first and a second surface for said second substrates, said second surface of said solder mask being in contact with said first surface of the first substrate;
  - (iv) points of electrical contact having been provided in the first and the second surface of said substrate for said second substrates;
  - (v) points of electrical interconnect in the first surface of said interconnect substrate being connected with said traces of the interconnect substrate, further being electrically connected with points of electrical interconnect provided in the second surface of said second substrates;
  - (vi) said solder mask exposing points of electrical contact provided in the first surface of said substrate for said second substrates;
  - vii) said second substrates further having been provided with a cut-out through said first substrate of a size allowing insertion of a semiconductor die therein, said insertion leaving a distance between sidewalls of said die and an internal perimeter of said cut-out through said first substrate;
- (b) attaching a copper foil to the second surface of said interconnect substrate;
- (c) inserting a semiconductor die in said cut-out provided in said first substrate for said second substrates, said semiconductor die having a first surface and a second surface, said first surface having been provided with points of electrical contact, said second surface of said semiconductor die being in contact with said first surface of said interconnect substrate;
- (d) providing wire bond connections between points of electrical contact provided in said first surface of said semiconductor die and said points of electrical contact in said first surface of said second substrates;
- (e) providing a mold compound surrounding the semiconductor die and the bond wires for said second substrates, said mold compound molding partially overlapping the first surface of the solder mask;
- (f) attaching solder balls to said points of electrical contact provided in said first surface of said second substrates, using the solder mask as a guide in placing the solder balls with respect to the second substrates; and
- (g) dividing said first substrate into second substrates, said second substrates comprising a semiconductor die.

6. The method of claim 5 with additional steps being performed prior to said attaching a copper foil, said additional steps comprising:
- optically inspecting said first substrate;
- pre-baking said first substrate; and
- mounting and dicing said first substrate to a desired size.

7. The method of claim 5 with additional steps being performed prior to said providing wire bond connections and after said inserting a semiconductor die in said cut-out provided in said substrate, said additional steps comprising:
- curing said first substrate; and
- plasma cleaning exposed surfaces of said first substrate.

8. The method of claim 5 with additional steps being performed after said inserting a semiconductor die in said cut-out and prior to said providing a mold compound surrounding the semiconductor die and the bond wires, said additional steps comprising:
- optically inspecting said first substrate; and
- plasma cleaning exposed surfaces of said first substrate.

9. The method of claim 5 with additional steps being performed after said providing a mold compound surrounding the semiconductor die and the bond wires and prior to said attaching solder balls, said additional steps comprising:
- providing a black ink topping on the second surface of said copper foil for said second substrates; and
- curing said black ink topping and said mold compound.

10. The method of claim 5 with an additional step being performed prior to said dividing or singulating said first substrate and after said attaching solder balls to said points of electrical contact and prior to said dividing said substrate into second substrates, said additional step comprising providing laser marking overlying the black ink topping for said second substrates.

11. The method of claim 5 with additional steps being performed after said dividing or singulating said substrate, said additional steps comprising:
- optically inspecting the singulated substrates for irregularities;
- electrically testing the second substrates;
- packaging second substrates that pass the electrical testing; and
- shipping the packaged second substrates.

12. The method of claim 5 wherein said substrate is selected from the group of substrates consisting of printed circuit boards, flex circuits, ceramic substrates, glass substrates and semiconductor device mounting support.

13. method of claim 5 wherein said step of attaching a copper foil to the second surface of said interconnect substrate is replaced with a step of attaching an adhesive film to the second surface of said interconnect substrate, wherein further additional steps of removing said adhesive film and attaching a copper foil to the second surface of said interconnect substrate are performed after said step of providing a mold compound surrounding the semiconductor die and the bond wires.

\* \* \* \* \*